(12) United States Patent
Higaki et al.

(10) Patent No.: US 10,076,048 B2
(45) Date of Patent: *Sep. 11, 2018

(54) EXTERNAL ACCESSORY TO BE ATTACHED TO ELECTRONIC APPARATUS AND SYSTEM

(71) Applicant: NIKON CORPORATION, Tokyo (JP)

(72) Inventors: Riichi Higaki, Matsudo (JP); Koichiro Kawamura, Ichihara (JP)

(73) Assignee: NIKON CORPORATION, Tokyo (JP)

( * ) Notice: Subject to any disclaimer, the term of this patent is extended or adjusted under 35 U.S.C. 154(b) by 599 days.

This patent is subject to a terminal disclaimer.

(21) Appl. No.: 14/581,415

(22) Filed: Dec. 23, 2014

(65) Prior Publication Data

US 2015/0156906 A1    Jun. 4, 2015

Related U.S. Application Data

(63) Continuation of application No. 13/796,419, filed on Mar. 12, 2013, now Pat. No. 8,964,114, which is a
(Continued)

(30) Foreign Application Priority Data

Jul. 25, 2008   (JP) .................................. 2008-192449
Jul. 15, 2009   (JP) .................................. 2009-167118

(51) Int. Cl.
| H05K 7/00 | (2006.01) |
|---|---|
| G01S 19/34 | (2010.01) |
| G06F 1/26 | (2006.01) |

(52) U.S. Cl.
CPC ................ *H05K 7/00* (2013.01); *G01S 19/34* (2013.01); *G06F 1/263* (2013.01);
(Continued)

(58) Field of Classification Search
CPC .................................................. H04N 5/23241
(Continued)

(56) References Cited

U.S. PATENT DOCUMENTS

| 6,101,339 A | 8/2000 | Miki et al. |
|---|---|---|
| 6,704,506 B2 | 3/2004 | Sasagawa |

(Continued)

FOREIGN PATENT DOCUMENTS

| JP | A-10-038993 | 2/1998 |
|---|---|---|
| JP | A-11-202041 | 7/1999 |

(Continued)

OTHER PUBLICATIONS

Jan. 3, 2012 Office Action issued in U.S. Appl. No. 12/458,830.
(Continued)

*Primary Examiner* — Christopher K Peterson
(74) *Attorney, Agent, or Firm* — Oliff PLC

(57) ABSTRACT

An external accessory that can be attached to and detached from an electronic apparatus equipped with a power source unit includes: a first power receiving unit that receives power from the power source unit of the electronic apparatus; a second power receiving unit that receives power from the power source unit of the electronic apparatus; a decision-making unit that makes a decision as to whether or not the first power receiving unit is receiving power; a function execution unit that executes a predetermined function by using power received at one of the first power receiving unit and the second power receiving unit; and a control unit that engages the function execution unit in operation continuously when an affirmative decision is made by the decision-making unit, and engages the function execution unit in operation intermittently when a negative decision is made by the decision-making unit.

10 Claims, 10 Drawing Sheets

Related U.S. Application Data continuation of application No. 12/458,830, filed on Jul. 23, 2009, now abandoned.

(52) U.S. Cl.
CPC ........ *Y10T 307/406* (2015.04); *Y10T 307/461* (2015.04); *Y10T 307/832* (2015.04)

(58) Field of Classification Search
USPC ........ 348/372, 207.2, 377; 327/544; 307/31, 307/38
See application file for complete search history.

(56) References Cited

U.S. PATENT DOCUMENTS

| | | | |
|---|---|---|---|
| 6,995,792 | B1 | 2/2006 | Ogura |
| 7,742,099 | B2 | 6/2010 | Ueno et al. |
| 7,847,729 | B2 | 12/2010 | Tysowski et al. |
| 2003/0011704 | A1* | 1/2003 | Sawachi ........... H04M 1/72527 348/372 |
| 2007/0182627 | A1 | 8/2007 | Ueno et al. |
| 2007/0263981 | A1 | 11/2007 | Ueno et al. |
| 2008/0049137 | A1 | 2/2008 | Endo |
| 2008/0094499 | A1* | 4/2008 | Ueno ...................... G01S 19/34 348/372 |
| 2008/0225128 | A1 | 9/2008 | Uchiyama et al. |
| 2009/0201082 | A1 | 8/2009 | Smith et al. |

FOREIGN PATENT DOCUMENTS

| | | |
|---|---|---|
| JP | A-2000-338219 | 12/2000 |
| JP | A 2001-128049 | 5/2001 |
| JP | A-2002-062347 | 2/2002 |
| JP | A-2003-188793 | 7/2003 |
| JP | A-2004-021218 | 1/2004 |
| JP | A-2006-262255 | 9/2006 |
| JP | B2 3915344 | 5/2007 |
| JP | A-2007-155577 | 6/2007 |
| JP | A 2007-158886 | 6/2007 |

OTHER PUBLICATIONS

Sep. 12, 2012 Office Action issued in U.S. Appl. No. 12/458,830.
Apr. 23, 2013 Office Action issued in Japanese Patent Application No. 2009-167118 (with translation).
Apr. 3, 2014 Office Action issued in U.S. Appl. No. 13/796,419.

* cited by examiner

FIG.3A

|  | PHOTOGRAPHING-READY STATE | STANDBY STATE | POWER OFF STATE |
|---|---|---|---|
| POWER SUPPLY TO EXTERNAL ACCESSORY THROUGH $V_{BAT}$ | ON | ON | ON |
| POWER SUPPLY TO EXTERNAL ACCESSORY THROUGH $V_{CC}$ | ON | OFF | OFF |
| REMAINING POWER DETECTION CIRCUIT | DETAILED DETECTION MODE | SIMPLIFIED DETECTION MODE | SIMPLIFIED DETECTION MODE |

DETAILS OF OPERATING STATES OF DIGITAL CAMERA 1

FIG.3B

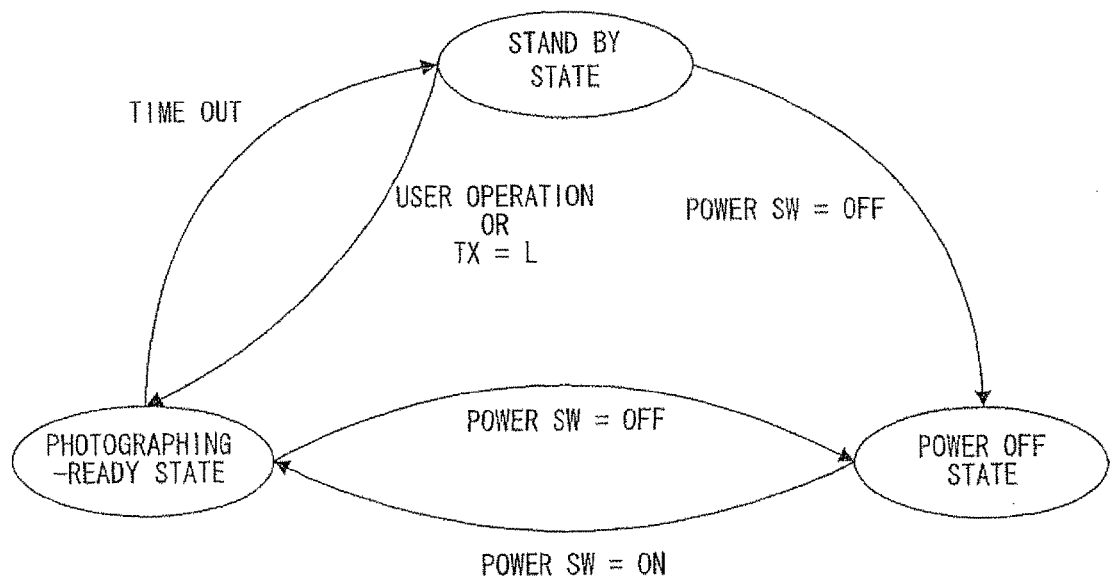

STATE TRANSITION AT DIGITAL CAMERA 1

FLOWCHART OF PROCESSING EXECUTED
WHEN POWER IS SUPPLIED TO GPS MODULE 3 THROUGH $V_{BAT}$

FLOWCHART OF PROCESSING STARTED IN DIGITAL CAMERA AS GPS MODULE 3 SETS TX SIGNAL TO L

EXTERNAL ACCESSORY TO BE ATTACHED TO ELECTRONIC APPARATUS AND SYSTEM

INCORPORATION BY REFERENCE

This is a Continuation of application Ser. No. 13/796,419 filed Mar. 12, 2013, which is a Continuation of application Ser. No. 12/458,830 filed Jul. 23, 2009, which in turn claims the benefit of priority to Japanese Patent Application No. 2009-167118 filed Jul. 15, 2009 and Japanese Patent Application No. 2008-192449 filed Jul. 25, 2008, the contents of which are incorporated herein by reference in their entirety.

BACKGROUND OF THE INVENTION

1. Field of the Invention

The present invention relates to a technology that makes it possible to reduce the power consumption of an external accessory attached to an electronic apparatus.

2. Description of Related Art

A portable electronic apparatus normally assumes a structure that allows external accessories, via which various functions are provided, to be attached thereto. Such external accessories include those that operate on power supplied from a battery in the electronic apparatus. The power supply to this type of external accessory is turned off immediately when the power to the electronic apparatus is turned off.

There are external accessories that require initialization processing and the results of the initialization processing may be retained over a predetermined length of time after the power to the accessory has been turned off. Such an external accessory may be utilized by intermittently executing the external accessory initialization processing while power at the electronic apparatus is in the OFF state so as to assure the following advantages. First, since the initialization processing does not need to be executed when the power to the external accessory is turned on, the length of wait time to elapse before the completion of the initialization processing is reduced. Second, unnecessary power consumption at the external accessory is minimized. Japanese Laid Open Patent Publication No. 2007-158886, for instance, discloses a technology for determining the operational intervals for a GPS module connected with an imaging apparatus based upon the frequency with which the imaging apparatus is used.

SUMMARY OF THE INVENTION

The technology disclosed in Japanese Laid Open Patent Publication No. 2007-158886 is conceived based on the premise that the GPS module is provided as a built-in unit in the imaging apparatus. Accordingly, the imaging apparatus sets the operational intervals with which the GPS module is engaged in intermittent operation. However, in the case of a universal external accessory, this setting must be selected at the external accessory itself. Namely, the technology in the related art described above does not assure desirable operating conditions in conjunction with universal external accessories.

According to the 1st aspect of the present invention, an external accessory that can be attached to and detached from an electronic apparatus equipped with a power source unit comprises: a first power receiving unit that receives power from the power source unit of the electronic apparatus; a second power receiving unit that receives power from the power source unit of the electronic apparatus; a decision-making unit that makes a decision as to whether or not the first power receiving unit is receiving power; a function execution unit that executes a predetermined function by using power received at one of the first power receiving unit and the second power receiving unit; and a control unit that engages the function execution unit in operation continuously when an affirmative decision is made by the decision-making unit, and engages the function execution unit in operation intermittently when a negative decision is made by the decision-making unit.

According to the 2nd aspect of the present invention, it is preferred that in the external accessory according to the 1st aspect, after engaging the function execution unit in operation intermittently a predetermined number of times, the control unit engages the function execution unit out of operation until the decision-making unit makes an affirmative decision.

According to the 3rd aspect of the present invention, it is preferred that in the external accessory according to the 1st aspect, when the control unit engages the function execution unit in operation following a predetermined length of time during which the control unit engages the function execution unit out of operation, the control unit executes initialization processing.

According to the 4th aspect of the present invention, it is preferred that in the external accessory according to the 1st aspect, the first power receiving unit and the second power receiving unit both receive power supplied from a single battery pack.

According to the 5th aspect of the present invention, it is preferred that the external accessory according to the 4th aspect further comprises a detection unit that detects remaining power in the battery pack, and when a negative decision is made by the decision-making unit, the control unit engages the function execution unit in operation intermittently based upon the remaining power.

According to the 6th aspect of the present invention, it is preferred that in the external accessory according to the 1st aspect, the function execution unit executes a function of calculating position information based upon a signal received from an external source.

According to the 7th aspect of the present invention, it is preferred that the external accessory according to the 6th aspect further comprises: a calculation unit that calculates displacement information with regard to displacement of the external accessory based upon the position information, and when a negative decision is made by the decision-making unit, the control unit engages the function execution unit in operation intermittently based upon the displacement information.

According to the 8th aspect of the present invention, it is preferred that the external accessory according to the 1st aspect further comprises: a light emitting unit that emits light by using an electrical charge stored in a capacitor, and the function execution unit executes a function of storing the electrical charge in the capacitor.

According to the 9th aspect of the present invention, it is preferred that in the external accessory according to the 1st aspect, the first power receiving unit receives power when the electronic apparatus is in a power ON state; and the second power receiving unit receives power when the electronic apparatus is not in the power ON state.

According to the 10th aspect of the present invention, it is preferred that in the external accessory according to the 1st aspect, the electronic apparatus is constituted with a camera.

According to the 11th aspect of the present invention, a system includes an electronic apparatus and an external accessory according to the 1st aspect.

According to the 12th aspect of the present invention, an external accessory that can be attached to and detached from an electronic apparatus comprises: a reception unit that receives a state signal indicating an operating state of the electronic apparatus; a decision-making unit that makes a decision based upon the state signal as to whether or not the operating state is a specific operating state; a function execution unit that executes a specific function; and a control unit that engages the function execution unit in operation continuously when an affirmative decision is made by the decision-making unit and engages the function execution unit in operation intermittently when a negative decision is made by the decision-making unit.

BRIEF DESCRIPTION OF THE DRAWINGS

FIGS. 3A and 3B provide details of operating states assumed in the digital camera, with FIG. 3A providing a chart of the operating states assumed in the digital camera 1 and FIG. 3B illustrating how the operating state of the digital camera shifts;

DESCRIPTION OF PREFERRED EMBODIMENTS

First Embodiment

In reference to drawings, the digital camera and the GPS (global positioning system) module achieved in an embodiment of the present invention are described. When the connection with the GPS module is on, the digital camera in the embodiment appends position information output from the GPS module to the photographic image.

Figure 1:
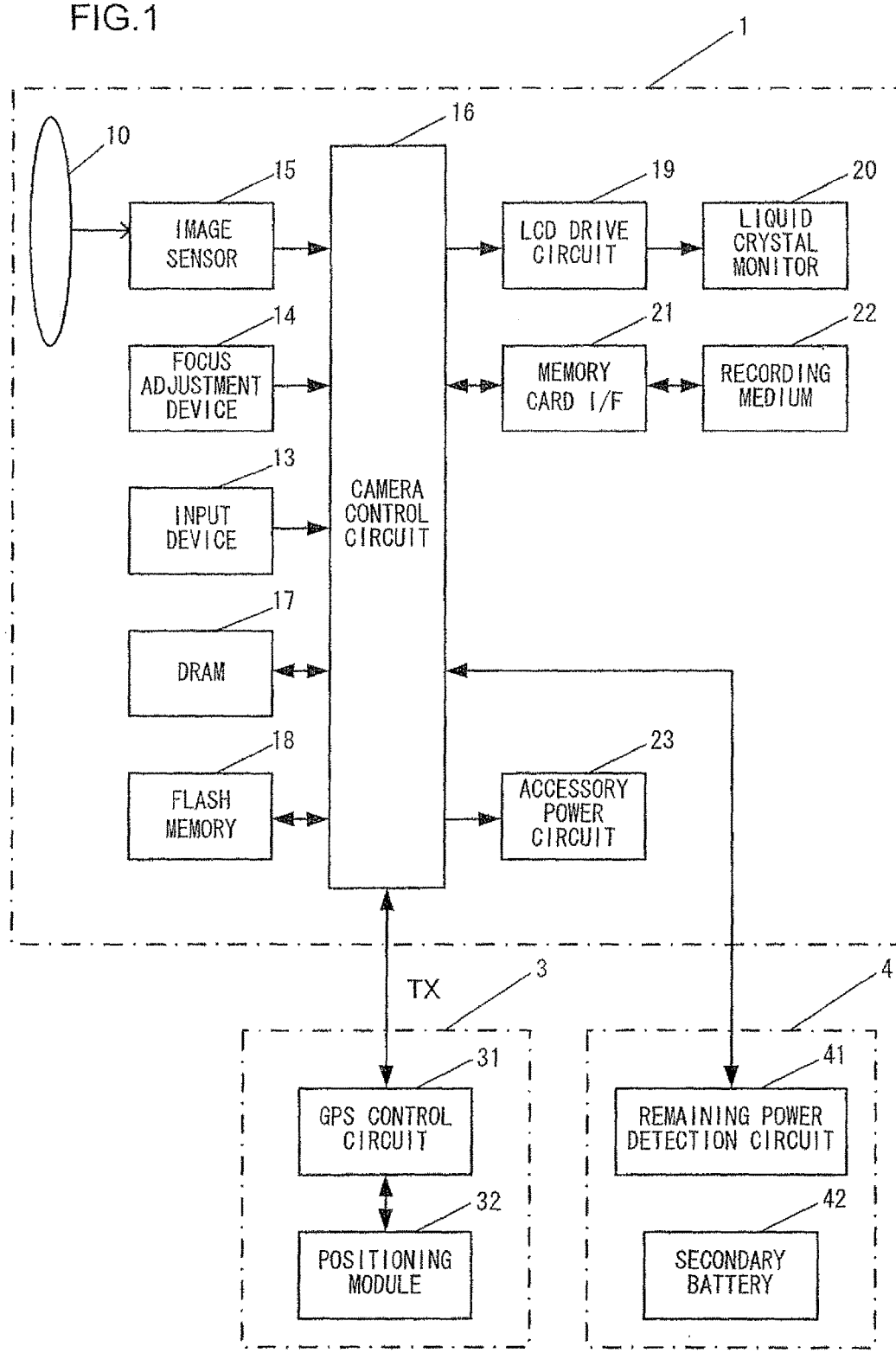
FIG. 1 is a block diagram showing the circuit structure adopted in the digital camera achieved in a first embodiment.

FIG. 1 is a block diagram showing the circuit structure adopted in the digital camera in the embodiment. The digital camera 1 includes an image sensor 15, a camera control circuit 16, a DRAM 17, a flash memory 18, an input device 13, a focus adjustment device 14, a memory card interface (I/F) 21, an LCD drive circuit 19, a liquid crystal monitor 20 and an external accessory power supply circuit 23.

The image sensor 15 is constituted with a CCD image sensor or a CMOS image sensor, equipped with a plurality of photoelectric conversion elements each disposed in correspondence to a pixel. The image sensor 15 captures a subject image formed on the imaging surface thereof and outputs photoelectric conversion signals (image signals) corresponding to the brightness of the subject image. R (red), G (green) and B (blue) color filters are disposed at the imaging surface of the image sensor 15, each in correspondence to a specific pixel position. Since the image sensor 15 captures the subject image through the color filters, the image signals output from the individual photoelectric conversion elements (pixels) hold color information expressed in the RGB calorimetric system.

The image signals output from the image sensor 15 are input to the camera control circuit 16. The camera control circuit 16 generates image data by executing various types of image processing on the image signals. The camera control circuit 16 then executes compression processing so as to compress, in a predetermined format such as the JPEG format, the image data having been generated, and records the compressed image data into a recording medium 22 in, for instance, the Exif format. The camera control circuit 16, which may be constituted with, for instance, an RISC, controls the various circuits shown in FIG. 1.

The focus adjustment device 14 executes a focus evaluation value calculation of the known art based upon the imaging signals output from the image sensor 15 and outputs the calculation results to the camera control circuit 16. Based upon the calculation results, the camera control circuit 16 drives a photographic lens 10 to the position with the largest focus evaluation value.

The DRAM 17 is used for temporary storage of data currently undergoing image processing, image compression processing and display image data generation processing, and of processed data resulting from the processing. Based upon image data having been generated by the camera control circuit 16, based upon an output from the image sensor 15 or based upon image data recorded in the recording medium 22, the camera control circuit 16 creates display image data. The display image data thus created are stored by the camera control circuit 16 into the DRAM 17. The flash memory 18 is a non-volatile memory with various processing programs that enable, for instance, the camera control circuit 16 to execute arithmetic operations stored therein.

Based upon an instruction issued by the camera control circuit 16, the LCD drive circuit 19 drives the liquid crystal monitor 20 to display an image at the liquid crystal monitor 20. In addition, setting menu screens, in which various settings of the digital camera are selected, are brought up on display at the liquid crystal monitor 20. The input device 13, which includes various operation buttons such as a shutter release button and a reproduction button, outputs an operation signal corresponding to an operation of a specific operation button by the user to the camera control circuit 16.

An external accessory such as a GPS module or a flash unit can be attached to the digital camera 1. Power is supplied to the attached external accessory through the external accessory power supply circuit 23. FIG. 1 shows a GPS module 3 connected to the camera.

The GPS module 3 includes a GPS control circuit 31 and a positioning module 32. Position information obtained via the positioning module 32 is transmitted by the GPS control circuit 31 to the camera control circuit 16 in the digital camera 1. An antenna (not shown) is connected to the positioning module 32 so as to enable the positioning module to receive signals from GPS satellites.

The power on which the digital camera 1 and the GPS module 3 operate is provided from a battery pack 4 mounted at the digital camera 1. The battery pack 4 includes a remaining power detection circuit 41 and a secondary battery 42. The remaining power detection circuit 41 detects the power remaining in the secondary battery 42 and transmits information indicating the remaining power to the camera control circuit 16 in the digital camera 1.

Either of the following two operation modes, a detailed detection mode and a simplified detection mode, can be selected for the remaining power detection circuit 41. In the detailed detection mode, the exact power remaining in the secondary battery 42 can be detected accurately by measuring the power consumption, at the secondary battery 42. In the detailed detection mode, the remaining power in the secondary battery 42 can be detected accurately by the remaining power detection circuit 41. However, the remaining power detection circuit 41 engaged in the power consumption measurement consumes power itself and thus, depletion of the secondary battery 42 is hastened. In the simplified detection mode, the remaining power in the secondary battery 42 is estimated by assuming a specific rate of power consumption and multiplying the specific rate by the length of time that has elapsed. The remaining power detection circuit 41, estimating the power consumption in the simplified detection mode, does not consume as much power as it does when measuring the power consumption in the detailed detection mode. However, the remaining power reading in the simplified detection mode is not as accurate as the remaining power reading in the detailed detection mode.

Figure 2:
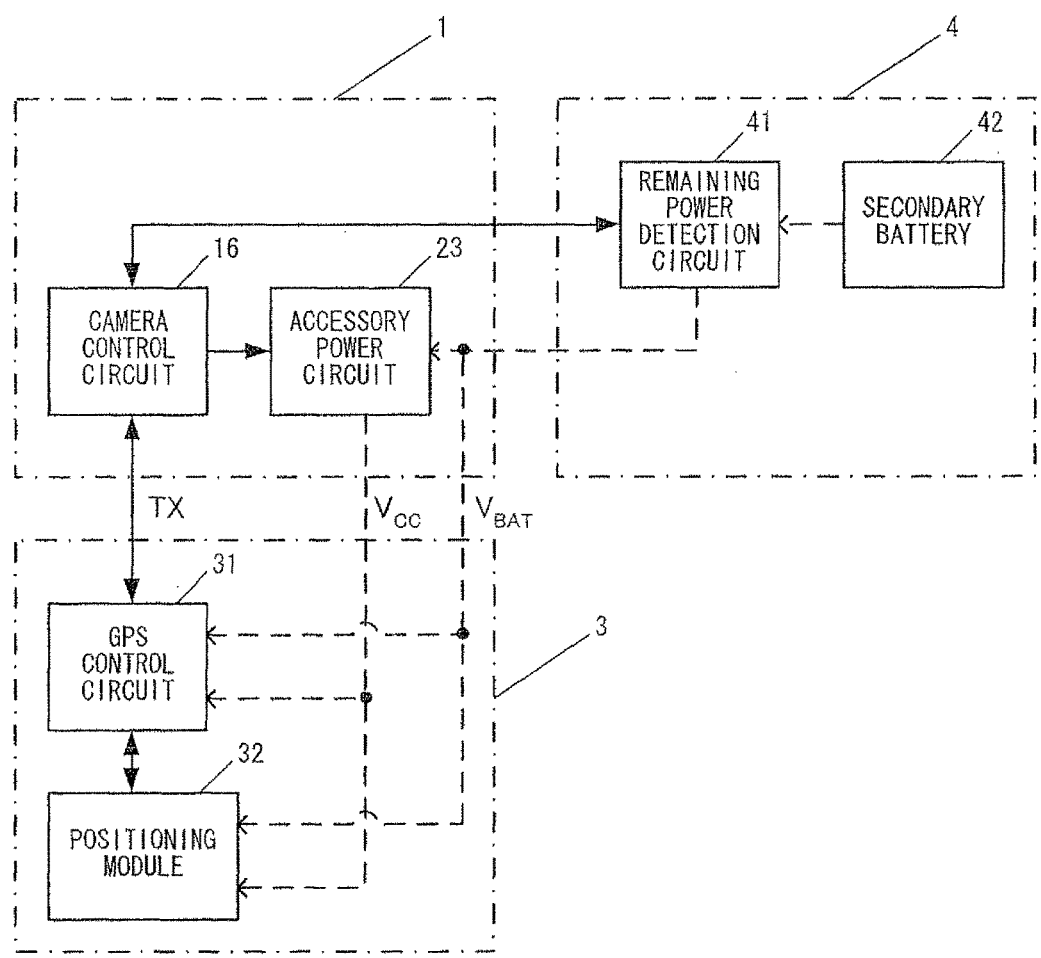
FIG. 2 illustrates the power supply path through which power is supplied to the GPS module.

FIG. 2 illustrates the power supply path through which power is supplied to the GPS module 3. The dotted line in the figure indicates the power supply path, whereas the solid line indicates the communication path. It is to be noted that FIG. 2 does not show the power supply paths corresponding to various components of the digital camera 1, other than the power supply path for the external accessory power supply circuit 23.

The power line from the secondary battery 42 is connected to the digital camera 1 and the GPS module 3 via the remaining power detection circuit 41. In the following description, the power line extending from the secondary battery 42 is referred to as VBAT. The remaining power detection circuit 41 monitors the power consumption at the secondary battery 42 and detects the remaining power in the secondary battery 42. The remaining power detected by the remaining power detection circuit 41 is hereafter referred to as estimated remaining power. In response to an inquiry originating from the camera control circuit 16, the remaining power detection circuit 41 transmits information indicating the estimated remaining power at the secondary battery 42 to the camera control circuit 16.

The external accessory power supply circuit 23 in the digital camera 1 supplies to the GPS module 3 a specific voltage obtained by converting a voltage supplied thereto from the remaining power detection circuit 41. In the following description, the power line extending from the external accessory power supply circuit 23 is referred to as VCC. The camera control circuit 16 is capable of starting/stopping the power supply to the GPS module 3 via the external accessory power supply circuit 23.

Power is supplied to the GPS control circuit 31 and the positioning module 32 through the VCC and the VBAT. In more specific terms, the GPS module 3 includes an electric contact point (not shown) at which power is received through the power line VCC and an electric contact point (not shown) at which power is received through the power line VBAT. These two electric contact points are connected to the GPS control circuit 31 and the positioning module 32. The GPS control circuit 31 and the positioning module 32 operate on the power supplied through the VCC while the power supply through the VCC is on and operate on power supplied through the VBAT otherwise. The GPS control circuit 31 and the camera control circuit 16 are connected with each other through a communication path TX, through which position information is transmitted. The state of the digital camera 1 is adjusted also via the transmission path TX through which the position information is transmitted.

Next, the operation executed in the GPS module 3 is described. The GPS module 3 receives signals transmitted from a plurality of satellites and obtains position information through calculation executed based upon information included in a signal. The signals are received and the position information calculation is executed at the positioning module 32. The control circuit 31 takes in the position information from the positioning module 32 and transmits the position information to the digital camera 1.

In order to obtain the position information through calculation, processing for searching for a plurality of satellites from which signals can be received and processing for selecting a specific satellite, the signal from which is to be used in the position information calculation, among the plurality of satellites indicated through the search, must be executed. For this reason, the GPS module 3, having become engaged in operation, cannot execute the position information calculation until the two processing phases are completed. It may take, for instance, 30 seconds or longer for the two processing phases to be completed. Once the satellite selection is completed, it takes the GPS module 3 as little as 5 seconds to execute the position information calculation It is to be noted that if no signal is received over a predetermined length of time from the satellite having been selected, the satellite search processing and the satellite selection processing need to be executed again, since the position of the GPS module 3 may have changed significantly in the meantime and it may be no longer possible to receive signals from the currently selected satellite.

Namely, assuming that the operation of the GPS module 3 starts when the digital camera 1 is powered up, it takes 30 seconds or longer for the position information to become available after the digital camera 1 enters the power ON state. Thus, there will be a significant time lag before the digital camera 1 can be used in an imaging operation.

If, on the other hand, the GPS module 3 is allowed to execute the position information calculation continually on the power supplied through the VBAT while the digital camera 1 is in the power OFF state, the time lag to elapse before an imaging operation is enabled once the digital camera 1 enters the power ON state is reduced. However, power consumption attributable to the GPS module 3 will be significant.

The GPS module 3 in the embodiment executes the position information calculation intermittently on the power supplied through the VBAT while the digital camera 1 is in the power OFF state. The position information calculation is executed only a predetermined number of times. When the GPS module 3 has executed the position information calculation the predetermined number of times while the digital camera 1 remains in the power OFF state, the GPS module 3 does not execute any further position information calculation until power to the digital camera 1 is turned on.

The GPS module 3 operates in either of two operating states, i.e., a standby state and an engaged state. The GPS module 3 in the engaged state engages all the circuits in operation. However, the GPS module 3 in the standby state does not engage the positioning module 32 and the circuit in the control circuit 31, via which the positioning module 32 is controlled, in operation. Thus, the power consumption at the GPS module 3 in the standby state is less than the power consumption of the GPS module 3 in the engaged state.

Next, the operating states that may be assumed in the digital camera 1 are described. The digital camera 1 assumes one of three operating states, i.e., a photographing-ready state, a standby state and a power OFF state. The user is able to capture an image with the digital camera 1 in the photographing-ready state, and the digital camera 1 in this state uses up more power than it does in the other operating states. In the standby state the digital camera 1 can immediately shift into the photographing-ready state and uses less power than it does in the photographing-ready state. The digital camera 1 is in the power OFF state before it is started up, and in the power OFF state, it uses the least amount of power.

FIGS. 3A and 3B provide details of the operating states assumed in the digital camera 1. FIG. 3A provides a detailed chart of the various operating states, whereas FIG. 3B illustrates how the digital camera in a given operating state may shift into another state.

As shown in FIG. 3A, the condition of power supply to the external accessory through the VCC and the operation mode in the remaining power detection circuit 41 change in correspondence to the operating state at the digital camera 1. When the digital camera 1 is not in the photographing-ready state, the power supply to the external accessory through the VCC is off. In addition, when the digital camera 1 is not in the photographing-ready state, the remaining power detection circuit 41 assumes the quick detection mode as its operation mode.

In reference to FIG. 3B, specific conditions under which the digital camera 1 shifts into the various operating states are described. As a power ON operation is performed at a power switch (not shown) at the digital camera 1 in the power OFF state, the digital camera 1 enters the photographing-ready state. If no user operation is performed for 8 consecutive seconds in the photographing-ready state, the digital camera 1 shifts into the standby state.

If the user performs an operation or the TX signal level is switched from H (high) to L (low) at the GPS module 3 while the digital camera 1 is in the standby mode, the digital camera enters the photographing-ready state. If a power off operation is performed at the power switch in either operating states, the digital camera 1 shifts into the power OFF state.

Next, the processing actually executed in the digital camera 1 and the GPS module 3 is described in detail in reference to drawings. The processing executed as the power supply to the GPS module 3 through the VBAT starts is described first and then the processing executed in the digital camera 1 as the TX signal level shifts from H to L is described.

Figure 4:
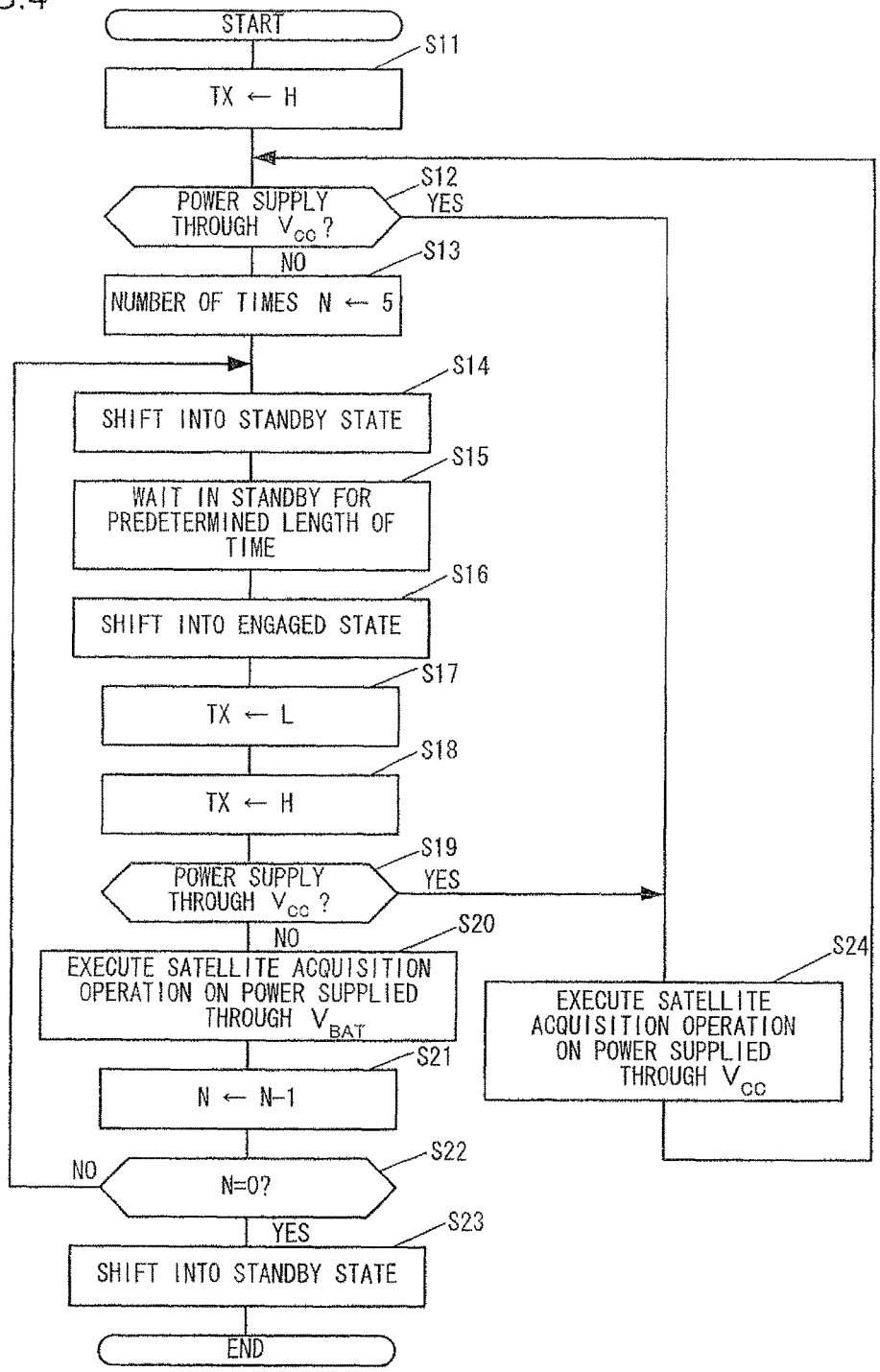
FIG. 4 presents a flowchart of the processing executed in the GPS module in the first embodiment after power supply via the VBAT starts.

FIG. 4 presents a flowchart of the processing executed in the GPS module 3 following the start of power supply through the VBAT. In step S11, the GPS control circuit 31 sets the TX signal level to H. In step S12, the GPS control circuit 31 makes a decision as to whether or not power is currently being supplied through the VCC. If power is currently being supplied through the VCC, an affirmative decision is made in step S12 and the operation proceeds to step S24. In step S24, the positioning module 32 executes a satellite acquisition operation on the power supplied through the VCC and obtains position information through calculation under control executed by the GPS control circuit 31, and then the operation returns to step S12. Namely, if power is being supplied through the VCC, the GPS control circuit 31 engages the positioning module 32 in continuous satellite acquisition operation. If a negative decision is made in step S12, the operation proceeds to step S13.

In step S13, the GPS control circuit 31 sets 5 for a variable N. In step S14, the GPS control circuit 31 sets the GPS module 3 in the standby state. In step S15, the GPS control circuit 31 waits in standby for a predetermined length of time (e.g., 30 minutes) to elapse. In step S16, the GPS control circuit 31 sets the GPS module 3 in the engaged state. In step S17, the GPS control circuit 31 sets the TX signal level to L. In step S18, the GPS control circuit 31 resets the TX signal level to H.

In step S19, the GPS control circuit 31 makes a decision as to whether or not the power supply through the VCC has started in response to the shift in the TX signal level to L having occurred in step S17. If power is being supplied through the VCC, an affirmative decision is made in step S19, and the operation proceeds to step S24. In step S24, the positioning module 32 executes a satellite acquisition operation on the power supplied through the VCC so as to obtain position information through calculation under control executed by the GPS control circuit 31, and then the operation returns to step S12. If a negative decision is made in step S19, the operation proceeds to step S20.

In step S20, the positioning module 32 executes a satellite acquisition operation on the power supplied through the VBAT so as to obtain position information through calculation under control executed by the GPS control circuit 31 and then the operation proceeds to step S21. In step S21, 1 is subtracted from the value held for the variable N. In step S22, the GPS control circuit 31 makes a decision as to whether or not the current value of the variable N is 0. If the current value of the variable N is not 0, a negative decision is made in step S22 and the operation returns to step S14. If an affirmative decision is made in step S22, the operation proceeds to step S23. In step S23, the GPS control circuit 31 sets the GPS module 3 in the standby state before ending the processing.

Figure 5:
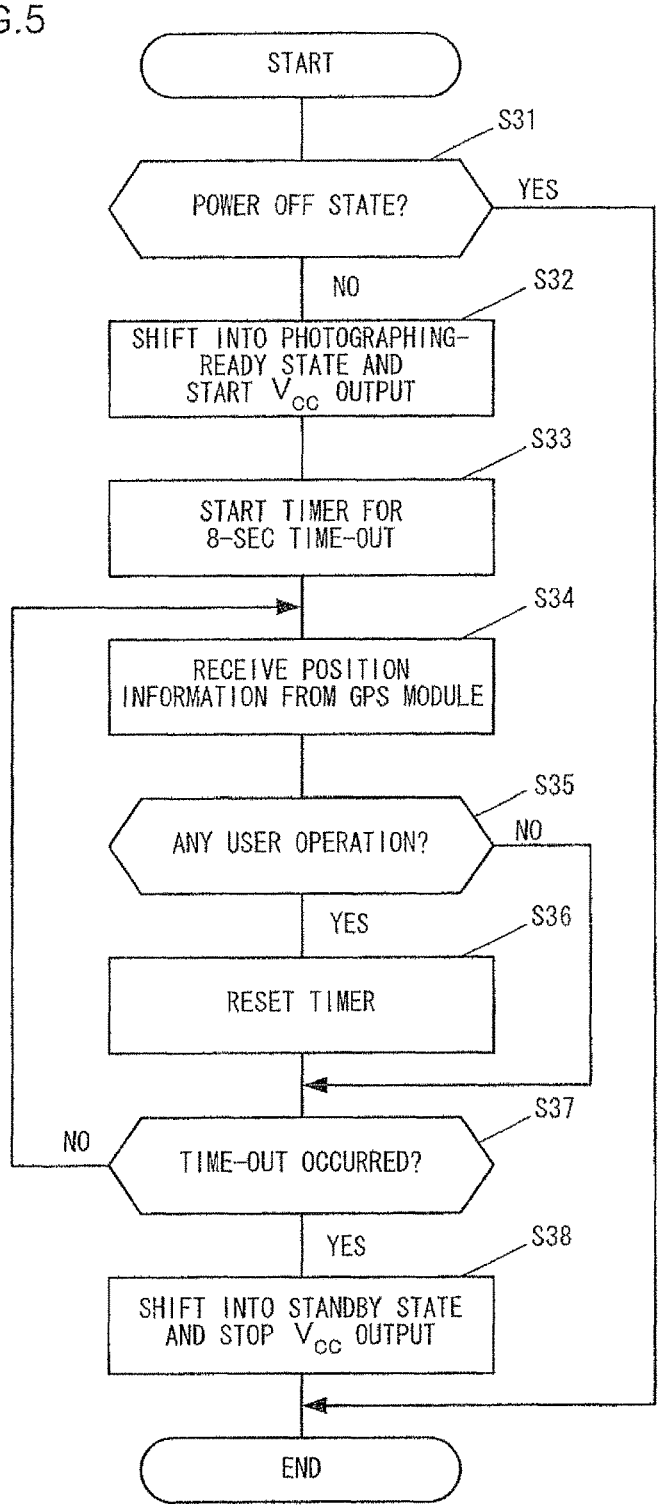
FIG. 5 presents a flowchart of the processing executed in the digital camera 1 as the TX signal level shifts from H to L.

FIG. 5 presents a flowchart of the processing executed in the digital camera 1 as the TX signal level shifts from H to L. The processing in all the steps in the flowchart presented in FIG. 5 is entirely executed by the camera control circuit 16. In step S31, the camera control circuit 16 makes a decision as to whether or not the digital camera 1 is in the power OFF state. If the digital camera 1 is currently in the power OFF state, an affirmative decision is made in step S31 and the processing ends. Namely, if the digital camera is in the power OFF state, the camera control circuit 16 does not execute any processing in response to the TX signal level shift. If a negative decision is made in step S31, the operation proceeds to step S32.

In step S32, the camera control circuit 16 shifts the digital camera 1 into the photographing-ready state. The digital camera 1 having entered the photographing-ready state starts power supply through the VCC. In step S33, the camera control circuit 16 starts a timer operation so that a time-out occurs after eight seconds. In step S34, the camera control circuit 16 receives the position information transmitted from the GPS module 3. In step S35, the camera control circuit 16 makes a decision as to whether or not the user performed an operation at the digital camera 1. If any user operation has been performed, an affirmative decision is made in step S35, and the operation proceeds to step S36. In step S36, the timer having been engaged in operation by the camera control circuit 16 in step S33 is reset so that a time-out occurs after another eight seconds, and then the operation proceeds to step S37. If a negative decision is made in step S35, the operation proceeds to step S37.

In step S37, the camera control circuit 16 makes a decision as to whether or not a time-out has occurred at the timer, the operation of which has been started up in step S33. If a time-out has not occurred, a negative decision is made in step S37 in the operation returns to step S34. If an affirmative decision is made in step S37, the operation proceeds to step S38. In step S38, the camera control circuit 16 sets the digital camera 1 in the standby state and then ends the processing. When the digital camera 1 is set in the standby state, power supply through the VCC stops.

The following advantages are achieved with the digital camera and the GPS module in the first embodiment described above.

(1) While power is supplied via the accessory power supply circuit 23, which supplies power only when the digital camera 1 is in the photographing-ready state, the GPS module 3 engages the positioning module 32 in continuous satellite acquisition operation. However, if the digital camera 1 is in the power OFF state and power is supplied only from the battery pack 4, which provides power regardless of the operating state of the digital camera 1, the satellite acquisition operation by the positioning module 32 is executed intermittently. Thus, the GPS module 3 is able to select the optimal operational setting for itself in correspondence to the power supply condition.

(2) When the digital camera 1 is in the power OFF state, the satellite acquisition operation by the positioning module 32 is executed only a predetermined number of times. As a result, the power consumption by the GPS module 3 while the digital camera 1 remains in the power OFF state over an extended period of time is reduced.

In the first embodiment described above, a decision is made at the GPS module 3 as to whether to execute the satellite acquisition operation continuously or intermittently in correspondence to the power supply conditions with respect to the power supply through the two power lines (VCC and VBAT). The conditions of power supply through the two power lines change in correspondence to the operating state of the digital camera 1, as shown in FIG. 3A. Accordingly, the GPS module 3 can be regarded to switch from the continuous satellite acquisition operation to the intermittent satellite acquisition operation and vice versa in correspondence to the operating state of the digital camera 1.

In the first embodiment described above, the external accessory attached to a portable electronic apparatus constituted with a digital camera is a GPS module. However, an external accessory other than a GPS module may be connected to the digital camera. In the second embodiment described in detail below, a flash module is connected to a digital camera.

Second Embodiment

Figure 6:
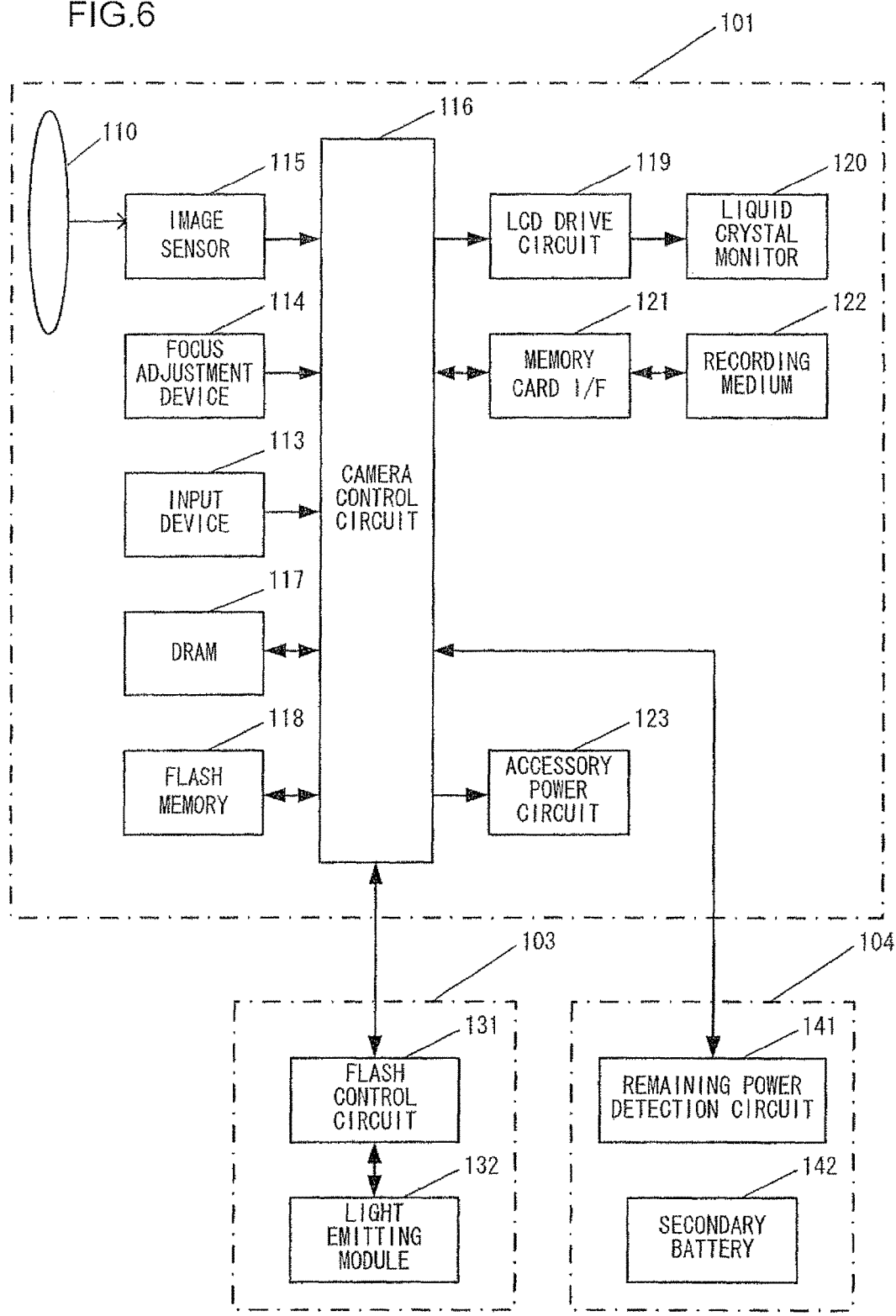
FIG. 6 is a block diagram showing the circuit structure adopted in the digital camera achieved in a second embodiment.

FIG. 6 is a block diagram showing the circuit structure of the digital camera achieved in the embodiment. A flash module 103, instead of the GPS module 3, is connected to a digital camera 101. The flash module 103 includes a flash control circuit 131 and a light emitting module 132.

When the digital camera 101 is in the power OFF state, the flash module 103 intermittently stores an electrical charge at the capacitor (not shown) via which light is emitted at the light emitting module 132 so as to ensure that the level of electrical charge stored in the capacitor does not become lower than a predetermined level. The flash module 103 executes the intermittent charge storage operation on the power supplied through the VBAT. If the electrical charge stored in the capacitor is lower than the predetermined level, light cannot be emitted at the light emitting module 132. The electoral charge storage operation is executed a predetermined number of times. Once the flash module 103 executes the electrical charge storage operation the predetermined number of times while the digital camera 1 remains in the power OFF state, the flash module does not execute further electrical charge storage operation in the capacitor until the power to the digital camera 101 is turned on.

If the digital camera 101 is in the photographing-ready state or the standby state, the flash module 103 continuously charges the capacitor so as to sustain the light emitting module 132 in the light emission-enabled state.

The digital camera and the flash module in the second embodiment described above achieve advantages similar to those of the digital camera and GPS module in the first embodiment.

In the second embodiment described above, the present invention is adopted in a portable electronic apparatus constituted with a digital camera. However, the present invention may be adopted equally effectively in a portable electronic apparatus other than a digital camera. In the third embodiment described in detail below, the present invention is adopted in conjunction with a portable electronic apparatus constituted with a portable information terminal.

Third Embodiment

Figure 7:
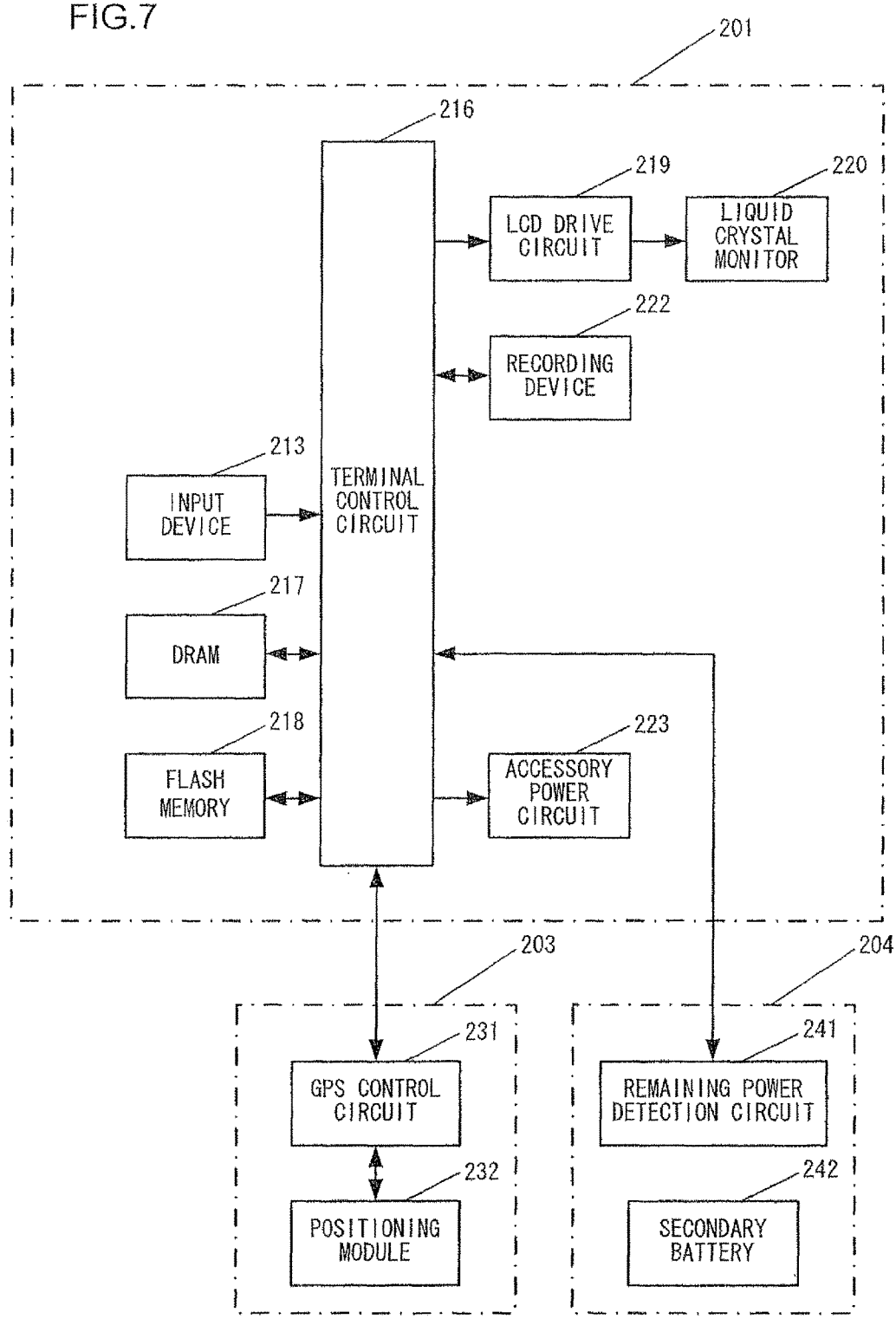
FIG. 7 is a block diagram showing the circuit structure adopted in the portable information terminal achieved in a third embodiment.

FIG. 7 is a block diagram showing the circuit structure of the portable information terminal achieved in the third embodiment. The portable information terminal 201 includes an input device 213, a terminal control circuit 216, a DRAM 217, a flash memory 218, a recording device 222, a liquid crystal monitor 220 and an external accessory power supply circuit 223.

As with the digital camera in the first embodiment, the information terminal 201 allows an external accessory such as a GPS module to be attached thereto. Once the external accessory is attached, power is supplied to the external accessory via the external accessory power supply circuit 223. FIG. 7 shows a GPS module 203 attached to the information terminal. In addition, the power on which the information terminal 201 and the GPS module 203 operate is provided from a battery pack 4 as in the first embodiment.

The portable information terminal and the GPS module in the third embodiment described above achieve advantages similar to those of the digital camera and GPS module in the first embodiment.

Fourth Embodiment

The digital camera achieved in the fourth embodiment assumes a structure similar to that of the digital camera in the first embodiment. It differs from the digital camera in the first embodiment only in that the GPS module, i.e., the external accessory, adjusts its operating state in correspondence to the remaining power at the secondary battery.

The digital camera 1 in the embodiment transmits information indicating the estimated remaining power RBAT in the secondary battery 42 to the GPS module 3. If the estimated remaining power RBAT exceeds a predetermined level R1, the GPS module 3 sets the number of times N that the position information calculation is to be executed to 5. If the estimated remaining power RBAT is equal to or less than the predetermined level R1, the GPS module 3 compares the estimated remaining power RBAT with another predetermined level R2. The predetermined level R2 is lower than the predetermined level R1. If the estimated remaining power RBAT exceeds a predetermined level R2, the GPS module 3 sets the number of times N that the position information calculation is to be executed to 2. If the estimated remaining power RBAT is equal to or less than the predetermined level R2, the GPS module 3 does not execute the position information calculation.

The digital camera transmits the information indicating the estimated remaining power RBAT in the secondary battery to the GPS module 3 immediately before the digital camera 1 shifts into the standby state. Namely, the digital camera 1 transmits the information indicating the estimated remaining power RBAT in the secondary battery to the GPS module 3 immediately before step S38 in the flowchart presented in FIG. 5.

Figure 8:
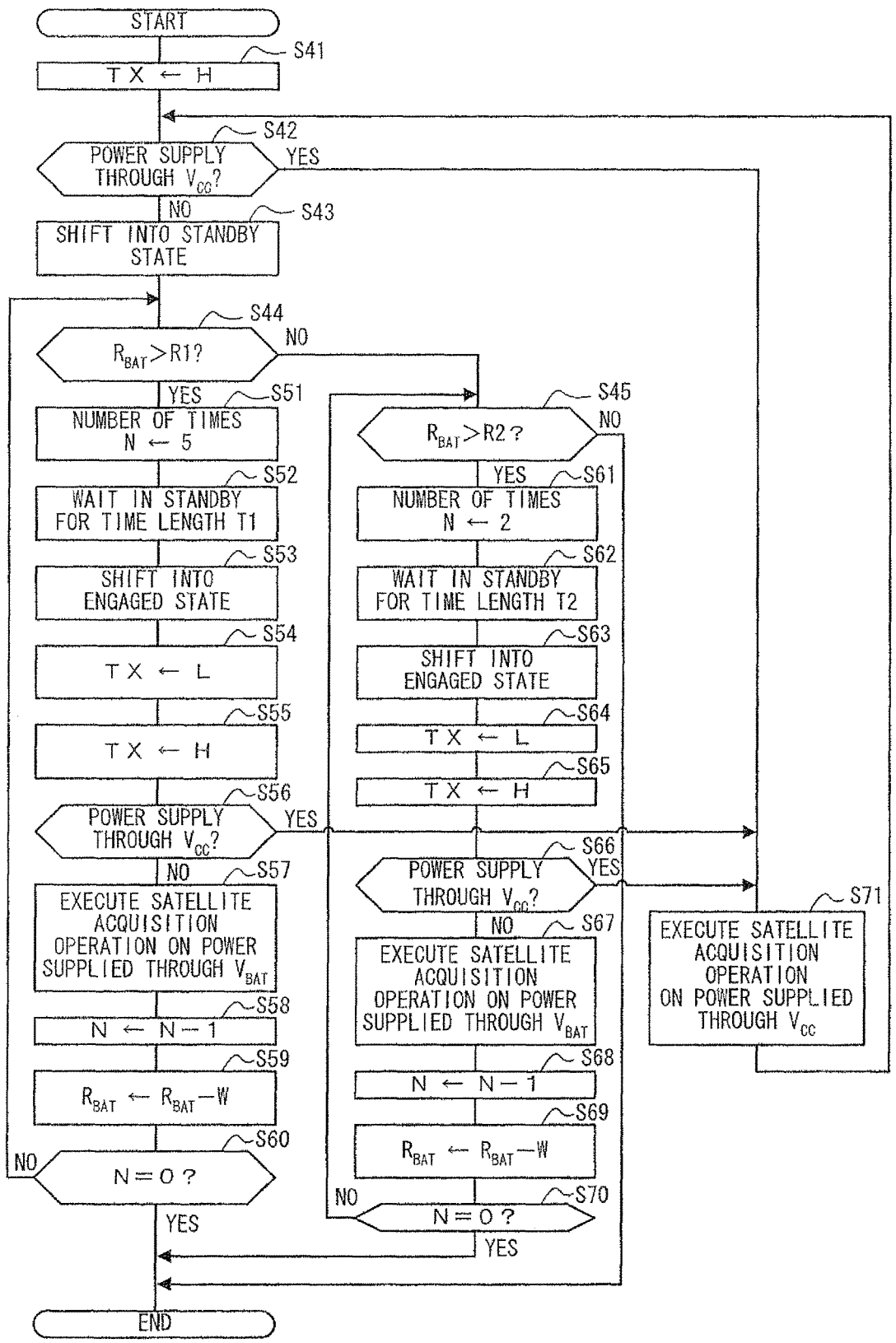
FIG. 8 presents a flowchart of the processing executed in the GPS module in a fourth embodiment after power supply via the VBAT starts.

FIG. 8 presents a flowchart of the processing executed in the GPS module 3 following the start of power supply through the VBAT in the fourth embodiment. When the processing in the flowchart in FIG. 8 is executed, the digital camera 1 is not in the photographing-ready state. This means that the GPS control circuit 31 is not able to receive the information indicating the estimated remaining power RBAT from the digital camera 1 while the execution of the processing in the flowchart presented in FIG. 8 is in progress. Accordingly, the GPS control circuit 31 holds the estimated remaining power RBAT having been received from the digital camera 1 most recently in storage. Then during the processing shown in FIG. 8, the estimated remaining power RBAT in storage is updated based upon the power consumption conditions.

In step S41, the GPS control circuit 31 sets the TX signal level to H. In step S42, the GPS control circuit 31 makes a decision as to whether or not power is currently supplied through the VCC. If the power supply through the VCC is on, an affirmative decision is made in step S42 and the operation proceeds to step S71. In step S71, the positioning module 32 executes a satellite acquisition operation on the power supplied through the VCC and obtains the position information through calculation under control executed by the GPS control circuit 31, and then the operation returns to step S42. If a negative decision is made in step S42, the operation proceeds to step S43.

In step S43, the GPS control circuit 31 sets the GPS module 3 in the standby state. In step S44, the GPS control circuit 31 makes a decision as to whether or not the estimated remaining power RBAT is greater than the predetermined level R1. If the estimated remaining power RBAT exceeds the predetermined level R1, the operation proceeds to step S51. In step S51, the GPS control circuit 31 sets 5 for the variable N representing the number of times the satellite acquisition operation is to be executed. In step S52, the GPS control circuit 31 waits in the standby state for a predetermined length of time T1 (e.g., 30 minutes) to elapse. In step S53, the GPS control circuit 31 sets the GPS module 3 in the engage state. In step S54, the GPS control circuit 31 sets the TX signal level to L. In step S55, the GPS control circuit 31 resets the TX signal level to H.

In step S56, the GPS control circuit 31 makes a decision as to whether or not the power supply through the VCC has started in response to the shift in the TX signal level to L having occurred in step S54. If power is being supplied through the VCC, an affirmative decision is made in step S56, and the operation proceeds to step S71. In step S71, the positioning module 32 executes a satellite acquisition operation on the power supplied through the VCC so as to obtain position information through calculation under control executed by the GPS control circuit 31, and then the operation returns to step S41. If a negative decision is made in step S56, the operation proceeds to step S57.

In step S57, the positioning module 32 executes a satellite acquisition operation on the power supplied through the VBAT so as to obtain position information through calculation under control executed by the GPS control circuit 31, and then the operation proceeds to step S58. In step S58, the GPS control circuit 31 subtracts 1 from the value held for the variable N. In step S59, the GPS control circuit 31 subtracts a predetermined value W from the estimated remaining power RBAT in storage. The predetermined value W represents the amount of power used up by the GPS module 3 each time it executes the satellite acquisition operation. In step S60, the GPS control circuit 31 makes a decision as to whether or not the current value of the variable N is 0. If the current value of the variable N is not 0, a negative decision is made in step S60 and the operation returns to step S44. If an affirmative decision is made in step S60, the processing ends.

If it is decided in step S44 that the estimated remaining power RBAT is equal to or less than the predetermined level R1, the operation proceeds to step S45. In step S45, the GPS control circuit 31 makes a decision as to whether or not the estimated remaining power RBAT is greater than the predetermined level R2. The predetermined level R2 is lower than the predetermined level R1. If the estimated remaining power RBAT exceeds the predetermined level R2, the operation proceeds to step S61. In step S61, the GPS control circuit 31 sets 2 for the variable N representing the number of times the satellite acquisition operation is to be executed. In step S62, the GPS control circuit 31 waits in the standby state for a predetermined length of time T2 (e.g., 10 minutes) to elapse. The predetermined length of time T2 is smaller than the predetermined length of time T1. Since the processing executed in steps S63~S70 is similar to the processing executed in steps S52~S60, a repeated explanation is not provided. If it is decided in step S45 that the estimated remaining power RBAT is equal to or less than the predetermined level R2, the processing in FIG. 8 ends.

In addition to the advantages of the digital camera and the GPS module in the first embodiment, the digital camera and the GPS module in the fourth embodiment described above achieve the following advantage.

For the intermittent satellite acquisition operation, the GPS control circuit 31 adjusts the number of times the satellite acquisition operation is to be executed based upon the remaining power in the secondary battery 42. In other words, control is executed so as to minimize power consumption when the remaining power in the secondary battery 42 is low.

Fifth Embodiment

The digital camera achieved in the fifth embodiment assumes a structure similar to that of the digital camera in the first embodiment. It differs from the digital camera in the first embodiment in that the GPS module, i.e., the external accessory, adjusts its operation in correspondence to the position information calculation results.

When executing the position reading operation intermittently, the GPS module 3 in the embodiment obtains through calculation displacement information indicating how the GPS module 3 has moved each time the position information is calculated. The displacement information as referred to in the description of the embodiment indicates a distance d from the position at which the previous position reading operation was executed. If the distance is d greater than a predetermined value D, i.e., if a displacement has occurred at a speed higher than a given speed, the GPS control circuit 31 increases the number of times the satellite acquisition operation is to be executed. If the distance d is equivalent to a minimum value, i.e., if the GPS module 3 is judged to have not moved, the satellite acquisition operation is aborted.

Figure 9:
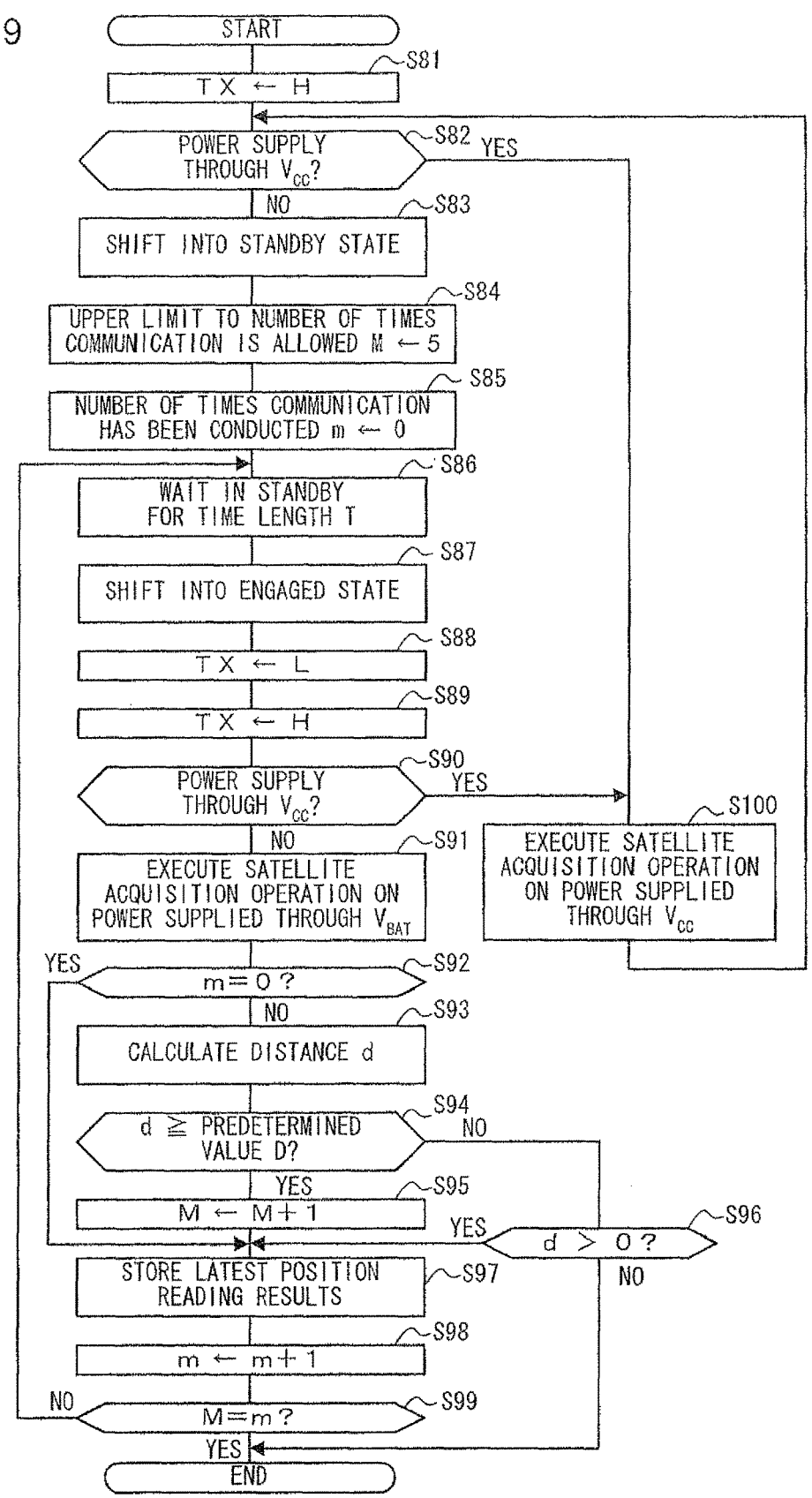
FIG. 9 presents a flowchart of the processing executed in the GPS module in a fifth embodiment after power supply via the VBAT starts.

FIG. 9 presents a flowchart of the processing executed in the GPS module 3 following the start of power supply through the VBAT in the fifth embodiment. In step S81, the GPS control circuit 31 sets the TX signal level to H. In step S82, the GPS control circuit 31 makes a decision as to whether or not power is currently being supplied through the VCC. If power is currently being supplied through the VCC, an affirmative decision is made in step S82 and the operation proceeds to step S100. In step S100, the positioning module 32 executes a satellite acquisition operation on the power supplied through the VCC and obtains position information through calculation under control executed by the GPS control circuit 31, and then the operation returns to step S82. If a negative decision is made in step S82, the operation proceeds to step S83.

In step S83, the GPS control circuit 31 sets the GPS module 3 in the standby state. In step S84, the GPS control circuit 31 sets 5 for a variable N representing the upper limit to the number of times communication with the satellite is allowed. In step S85, the GPS control circuit 31 sets 0 for a variable m representing the number of times communication with the satellite has been conducted. In step S86, the GPS control circuit 31 waits in the standby state for a predetermined length of time T (e.g., 30 minutes) to elapse. In step S87, the GPS control circuit 31 sets the GPS module 3 in the engage state. In step S88, the GPS control circuit 31 sets the TX signal level to L. In step S89, the GPS control circuit 31 resets the TX signal level to H.

In step S90, the GPS control circuit 31 makes a decision as to whether or not the power supply through the VCC has started in response to the shift in the TX signal level to L having occurred in step S88. If power is being supplied through the VCC, an affirmative decision is made in step S90, and the operation proceeds to step S100. In step S100, the positioning module 32 executes a satellite acquisition operation on the power supplied through the VCC so as to obtain position information through calculation under control executed by the GPS control circuit 31 and then the operation returns to step S81. If a negative decision is made in step S90, the operation proceeds to step S91.

In step S91, the positioning module 32 executes a satellite acquisition operation on the power supplied through the VBAT so as to obtain position information through calculation under control executed by the GPS control circuit 31 and then the operation proceeds to step S92. In step S92, the GPS control circuit 31 makes a decision as to whether or not 0 is currently set for the variable m. If 0 is set for the variable m, the operation proceeds to step S97. If a value other than 0 is set for the variable m, the operation proceeds to step S93. In step S93, the GPS control circuit 31 calculates the distance d based upon the position information having been most recently stored in step S97 to be detailed later and the latest position information obtained through calculation in step S91. In step S94, the GPS control circuit 31 makes a decision as to whether or not the distance d is equal to or greater than the predetermined value D. If the distance d is judged to be equal to or greater than the predetermined value D, the operation proceeds to step S95. In step S95, the GPS control circuit 31 increments by 1 the variable M indicating the upper limit to the number of times communication with the satellite is allowed.

If it is decided in step S94 that the distance d is less than the predetermined value D, the operation proceeds to step S96. In step S96, the GPS control circuit 31 makes a decision as to whether or not the distance d exceeds 0. It is to be noted that the distance d may be compared with a very small value ε instead of 0. If the distance d exceeds 0, the operation proceeds to step S97. If the distance d is judged to be 0, the processing in the flowchart presented in FIG. 9 ends.

In step S97, the GPS control circuit 31 stores the latest position information most recently calculated in step S91. In step S98, the GPS control circuit 31 increments by 1 the variable m representing the number of times communication with the satellite has been conducted. In step S99, the GPS control circuit 31 makes a decision as to whether or not the variable M and the variable m are equal. If the variable M and the variable m are not equal to each other, the operation returns to step S86. However, if the variable M and the variable m are equal, the processing in the flowchart presented in FIG. 9 ends.

In addition to the advantages of the digital camera and the GPS module in the first embodiment, the digital camera and the GPS module in the fifth embodiment described above achieve the following advantage.

The GPS control circuit 31 adjusts the upper limit to the number of times the satellite acquisition operation is to be executed intermittently based upon the displacement information. Through these measures, it is ensured that satellite acquisition can be sustained even as the current position changes rapidly.

Sixth Embodiment

The digital camera achieved in the sixth embodiment assumes a structure similar to that of the digital camera in the first embodiment. It differs from the digital camera in the first embodiment in that information indicating the digital camera operating state is received at the GPS module attached as an external accessory and that the satellite acquisition operation is executed intermittently when the digital camera is in a specific state.

The digital camera 1 in the embodiment is capable of executing processing for reproducing images recorded in the recording medium 22 in a slideshow and processing for outputting an image to an external display device connected to the digital camera 1. In the following explanation, the digital camera 1 is described to be in a "reproduction state" when either processing is in progress in the digital camera 1.

Upon entering the reproduction state, the digital camera 1 in the embodiment provides the GPS module 3 with a reproduction state notice. In addition, after exiting the reproduction state, the digital camera 1 informs the GPS module 3 that it is no longer in the reproduction state. The notices are provided through the communication path TX. These notices received at the GPS module 3 via the communication path TX enable the GPS module to ascertain whether or not the digital camera 1 is in the reproduction state. Namely, the GPS module 3 is able to monitor whether or not the digital camera 1 is currently in the reproduction state, at all times. The GPS module 3 in the embodiment executes intermittent satellite acquisition operation on the power supplied through the VBAT instead of the VCC when the digital camera 1 is in the reproduction state.

Figure 10:
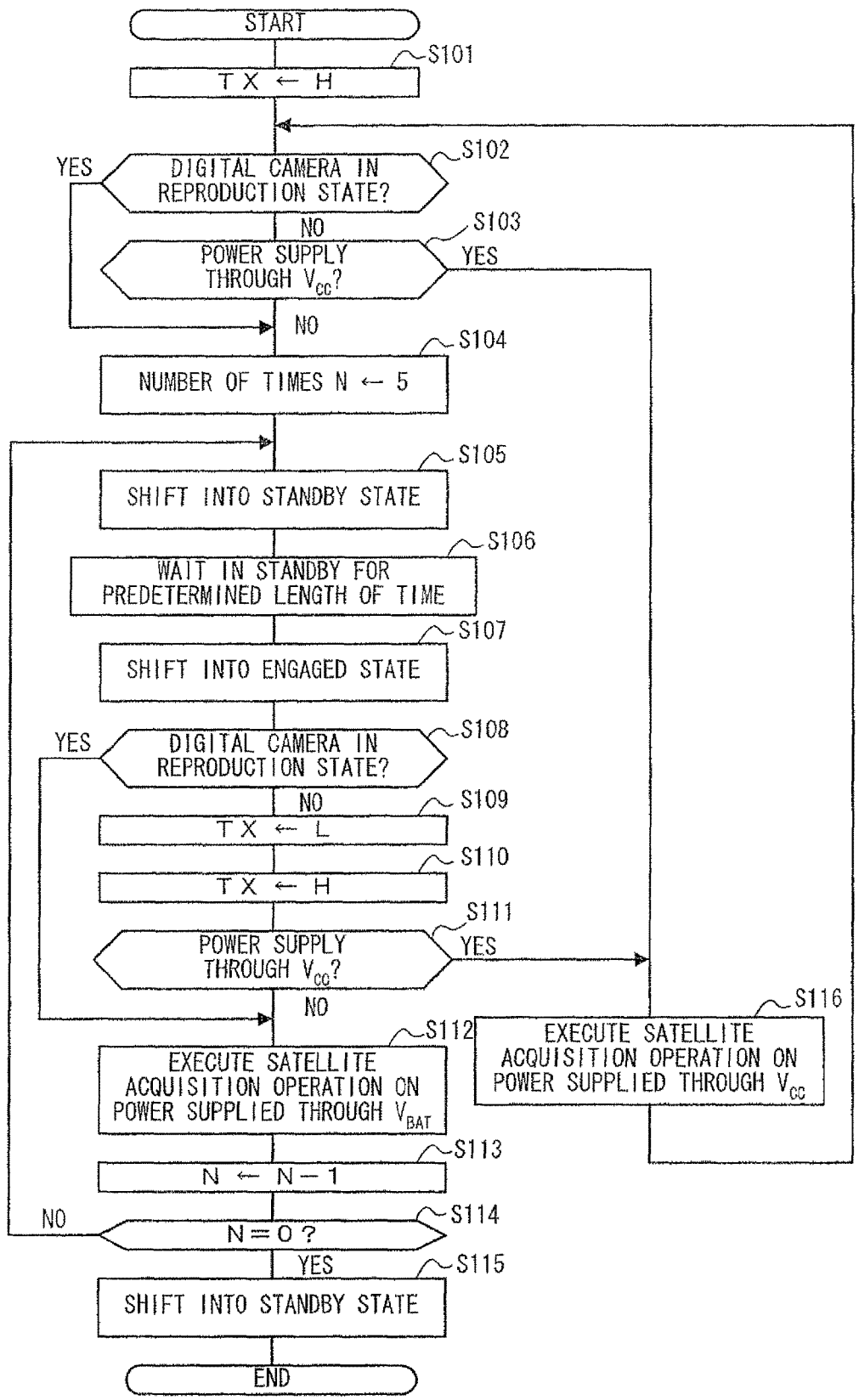
FIG. 10 presents a flowchart of the processing executed in the GPS module in a sixth embodiment after power supply via the VBAT starts.

FIG. 10 presents a flowchart of the processing executed in the GPS module 3 following the start of power supply through the VBAT in the sixth embodiment. In step S101, the GPS control circuit 31 sets the TX signal level to H. In step S102, the GPS control circuit 31 makes a decision as to whether or not the digital camera 1 is currently in the reproduction state. If the digital camera 1 is in the reproduction state, the operation proceeds to step S104. If the digital camera 1 is not in the reproduction state, the operation proceeds to step S103.

In step 3103, the GPS control circuit 31 makes a decision as to whether or not the power is currently being supplied through the VCC. If power is being supplied through the VCC, an affirmative decision is made in step 3103 and the operation proceeds to step S116. In step S116, the positioning module 32 executes a satellite acquisition operation on the power supplied through the VCC and obtains position information through calculation under control executed by the GPS control circuit 31 and then the operation returns to step S102. If a negative decision is made in step S103, the operation proceeds to step 3104.

In step S104, the GPS control circuit 31 sets 5 for the variable N indicating the number of times the satellite acquisition operation is to be executed. In step S105, the GPS control circuit 31 sets the GPS module 3 in the standby state. In step S106, the GPS control circuit 31 waits in standby for a predetermined length of time (e.g., 30 minutes) to elapse. It is to be noted that even while the GPS module 3 waits in the standby state, the GPS control circuit 31 continues to receive the reproduction state notices from the digital camera 1. In step S107, the GPS control circuit 31 sets the GPS module 3 in the engaged state.

In step S108, the GPS control circuit 31 makes a decision as to whether or not the digital camera 1 is in the reproduction state. If the digital camera 1 is in the reproduction state, the operation proceeds to step S112. If the digital camera 1 is not in the reproduction state, the operation proceeds to step S109. Since the processing executed in steps S109~S115 is similar to the processing executed in steps S17~S23 in FIG. 4, a repeated explanation is not provided.

In addition to the advantages of the digital camera and the GPS module in the first embodiment, the digital camera and the GPS module in the sixth embodiment described above achieve the following advantage.

When the digital camera 1 is not in the reproduction state, the positioning module 32 in the GPS module 3 is engaged in continuous satellite acquisition operation. However, the satellite acquisition operation by the positioning module 32 is executed intermittently when the digital camera 1 is in the reproduction state. As a result, power consumption at the positioning module 32 can be reduced whenever the position information is not required.

It is to be noted that the following variations are also within the scope of the present invention and that one of the variations or a plurality of the variations may be adopted in combination with any of the embodiments described above.

(Variation 1)

When the digital camera 1 is in the power OFF state, the satellite acquisition operation may be executed at the GPS module 3, after random time intervals, instead of over constant equal time intervals.

(Variation 2)

The battery pack may be installed within the electronic apparatus or it may be an external battery pack connected to the electronic apparatus.

(Variation 3)

While the portable electronic apparatus and the external accessory are provided with power from a common battery pack in the embodiments described above, the present invention may instead be adopted in conjunction with an electronic apparatus and an external accessory provided with power individually supplied from dedicated battery packs.

(Variation 4)

While the GPS module 3 and the flash module 103 each represent the external accessory according to the present invention in the description of the embodiments provided above, the present invention is not limited to these examples and it may be adopted in conjunction with another type of external accessory.

(Variation 5)

The displacement information in the fourth embodiment may indicate the displacement velocity instead of the distance. Namely, instead of comparing the distance d with the predetermined value D, the displacement velocity v may be compared with a predetermined velocity V. In addition, when the distance d is equal to or greater than the predetermined value D or the displacement velocity v is equal to or greater than the predetermined velocity V, the length of wait time may be reduced in, for instance, 5-minute increments, instead of increasing the value held for the variable M indicating the upper limit to the number of times communication is allowed. Furthermore, the value held for the variable M may be increased and the length of wait time T may be reduced in combination. The extent to which the wait time T is reduced may be adjusted in correspondence to the distance d or the displacement velocity v. For instance, the wait time T may be reduced in 8-minute increments when the displacement velocity v is equal to or greater than 50 km/h, whereas the wait time T may be reduced in 5-minute increments when the displacement velocity v is less than 50 km/h.

(Variation 6)

Only the VCC power line may be connected to the GPS module 3 in the sixth embodiment. In such a case, when the GPS module 3 is engaged in intermittent operation, it is driven on power provided through the VCC. In addition, even as the operating state of the digital camera 1 shifts into the standby state, the power supply through the VCC is sustained.

(Variation 7)

The digital camera 1, at which processing other than the image slideshow reproduction processing or the image output processing for outputting an image to an external device described in reference to the sixth embodiment is in progress, may be regarded to be in the reproduction state. For instance, the digital camera currently displaying thumbnail images may be regarded to be in the reproduction state. In addition, the present invention may be adopted in conjunction with an operating state other than the reproduction state described earlier. More specifically, the GPS module 3 can be engaged in operation only intermittently as long as the digital camera 1 does not need to use position information obtained through calculation at the GPS module 3. For instance, a GPS module connected to a single-lens reflex digital camera may be engaged in intermittent operation when no interchangeable lens is mounted at the digital camera. As a further alternative, the GPS module may be engaged in intermittent operation when no recording medium is loaded or when the available memory space in the recording medium is equal to or less than a predetermined quantity.

The above described embodiments are examples, and various modifications can be made without departing from the scope of the invention.

What is claimed is:

1. An external accessory that can be attached to and detached from an electronic apparatus which has a first power line and a second power line, the external accessory comprising:
- a first power receiver that is configured to receive power through the first power line of the electronic apparatus;
- a second power receiver that is configured to receive power through the second power line of the electronic apparatus;
- a function execution circuit that executes a predetermined function; and
- a control unit that controls the function execution circuit so as to reduce power consumption when the second power receiver is receiving power through the second power line, compared to power consumption when the first power receiver is receiving power through the first power line.

2. The external accessory according to claim 1, wherein:
the first power receiver and the second power receiver both receive power supplied from a single battery pack.

3. The external accessory according to claim 1, wherein:
the first power receiver receives power from the first power line when the electronic apparatus is in a power ON state, and
the second power receiver receives power from the second power line when the electronic apparatus is not in the power ON state.

4. The external accessory according to claim 1, wherein:
the electronic apparatus is constituted with a camera.

5. A system that includes an electronic apparatus and an external accessory according to claim 1.

6. An attachable accessory device that can be attached to and detached from an electronic apparatus which has a first power line and a second power line, the accessory device comprising:
- a first power receiver that is configured to receive power through the first power line of the electronic apparatus;
- a second power receiver that is configured to receive power through the second power line of the electronic apparatus;
- a function execution circuit that executes a predetermined function; and
- a control unit that controls the function execution circuit so as to reduce power consumption when the second power receiver is receiving power through the second power line, compared to power consumption when the first power receiver is receiving power through the first power line.

7. The attachable accessory device according to claim 6, wherein:
the first power receiver and the second power receiver both receive power supplied from a single battery pack.

8. The attachable accessory device according to claim 6, wherein:
the first power receiver receives power from the first power line when the electronic apparatus is in a power ON state: and
the second power receiver receives power from the second power line when the electronic apparatus is not in the power ON state.

9. The attachable accessory device according to claim 6, wherein:
the electronic apparatus is constituted with a camera.

10. A system that includes an electronic apparatus and an attachable accessory device according to claim 6.

* * * * *